United States Patent
Lee

(10) Patent No.: US 10,707,365 B2
(45) Date of Patent: Jul. 7, 2020

(54) PROTECTIVE GLASS FOR SOLAR CELL MODULE AND MANUFACTURING METHOD FOR THE SAME

(71) Applicant: Lsis Co., Ltd., Gyeonggi-do (KR)

(72) Inventor: Yil-Hwa Lee, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 316 days.

(21) Appl. No.: 15/585,406

(22) Filed: May 3, 2017

(65) Prior Publication Data

US 2018/0190846 A1    Jul. 5, 2018

(30) Foreign Application Priority Data

Dec. 29, 2016    (KR) .................. 10-2016-0182379

(51) Int. Cl.
*B32B 15/04*     (2006.01)
*B32B 17/06*     (2006.01)
(Continued)

(52) U.S. Cl.
CPC ............ *H01L 31/048* (2013.01); *C03B 23/20* (2013.01); *C03C 12/00* (2013.01); *C03C 17/02* (2013.01);
(Continued)

(58) Field of Classification Search
USPC ........................................................ 428/426
See application file for complete search history.

(56) References Cited

U.S. PATENT DOCUMENTS 2,378,252 A * 6/1945 Staehle ................ G03B 21/625
                                                    359/453
2,713,286 A * 7/1955 Taylor .................... G02B 5/128
                                                    359/541
(Continued)

FOREIGN PATENT DOCUMENTS

CN    202772160 U    3/2013
JP    H10645628 A    2/1994
(Continued)

OTHER PUBLICATIONS https://www.swiftglass.com/blog/the-benefits-of-glass-tempering-and-strengthening/, 2015.*

(Continued)

*Primary Examiner* — Lauren R Colgan
(74) *Attorney, Agent, or Firm* — K&L Gates LLP

(57) ABSTRACT

The present disclosure provides a protective glass for a solar cell module having improved power generation efficiency of a solar cell obtained by minimizing reflection of light incident onto the protective glass, and a manufacturing method for the same. The protective glass for a solar cell module includes a plurality of glass beads formed in a spherical or hemispherical shape and arranged in the horizontal direction. The plurality of glass beads is disposed on at least one of the upper and lower portions of the sealing member.
In addition, the method of manufacturing a protective glass for a solar cell module includes preparing a plurality of glass beads formed in a spherical or hemispherical shape, arranging the glass beads in a horizontal direction, and injecting a molten glass solution into the glass beads and forming the protective glass.

8 Claims, 3 Drawing Sheets

(51) Int. Cl.
*H01L 31/048* (2014.01)
*C03C 17/02* (2006.01)
*C03C 12/00* (2006.01)
*C03B 23/20* (2006.01)
*G02B 5/02* (2006.01)
*H01L 31/0236* (2006.01)

(52) U.S. Cl.
CPC ...... *G02B 5/0226* (2013.01); *H01L 31/02366* (2013.01); *Y02E 10/52* (2013.01)

(56) References Cited

U.S. PATENT DOCUMENTS

| | | | | |
|---|---|---|---|---|
| 3,552,822 | A * | 1/1971 | Altman | G03B 21/625 359/453 |
| 5,354,385 | A * | 10/1994 | Hashimoto | H01L 31/048 136/251 |
| 5,563,738 | A * | 10/1996 | Vance | |
| 6,076,933 | A * | 6/2000 | DiLoreto | G02B 3/0043 359/452 |
| 6,204,971 | B1 * | 3/2001 | Morris | C03C 12/00 359/453 |
| 6,261,402 | B1 * | 7/2001 | Watanabe | B29C 70/64 156/230 |
| 6,344,263 | B1 * | 2/2002 | Moshrefzadeh | |
| 6,466,368 | B1 * | 10/2002 | Piepel | G03B 21/625 359/452 |
| 6,468,378 | B1 * | 10/2002 | Hannington | |
| 6,567,215 | B2 * | 5/2003 | Ballen | |
| 6,939,014 | B1 * | 9/2005 | Vance | G02B 3/0043 359/454 |
| 7,248,406 | B2 * | 7/2007 | May | |
| 7,727,616 | B2 * | 6/2010 | Hsu | C09D 7/70 428/141 |
| 7,787,180 | B2 * | 8/2010 | Hannington | |
| 8,974,899 | B1 * | 3/2015 | Wilt | H01L 31/0481 136/244 |
| 2002/0109920 | A1 * | 8/2002 | Hannington | |
| 2004/0051945 | A1 | 3/2004 | Adachi et al. | |
| 2004/0090684 | A1 * | 5/2004 | Wolfe | |
| 2004/0190144 | A1 * | 7/2004 | Hannington | |
| 2008/0008873 | A1 * | 1/2008 | Catalfamo | B65D 65/466 428/325 |
| 2009/0135489 | A1 | 5/2009 | Ryu et al. | |
| 2012/0028406 | A1 | 2/2012 | Lucas et al. | |
| 2013/0284257 | A1 * | 10/2013 | Gilchrist | H01G 9/2068 136/256 |
| 2014/0178642 | A1 * | 6/2014 | Milanovska | C03C 17/007 428/143 |
| 2018/0029339 | A1 * | 2/2018 | Niu | B29C 70/78 |

FOREIGN PATENT DOCUMENTS

| | | |
|---|---|---|
| JP | 107263727 A | 10/1995 |
| JP | H11330508 A | 11/1999 |
| JP | 2001230441 A | 8/2001 |
| JP | 2003110128 A | 4/2003 |
| JP | 2010087206 A | 4/2010 |
| JP | 2012047020 A | 3/2012 |
| JP | 2013-109923 A | 6/2013 |
| JP | 5557200 B2 | 6/2014 |
| JP | 2015057836 A | 3/2015 |
| JP | 2015177192 A | 10/2015 |
| KR | 20-0459976 Y1 | 4/2012 |
| KR | 10-1516151 B1 | 4/2015 |
| WO | 98/45753 A1 | 10/1998 |
| WO | 99/37949 A1 | 7/1999 |

OTHER PUBLICATIONS

Meissner, Dieter "Photovoltaics Based on Semiconductor Powders"; Tallinn University of Technology, Dpt. of Materials Science, Ehitajate tee 5, 19086 Tallinn, Estonia; FORMATEX; 2013.
Japanese Office Action for related Japanese Application No. 2017-091780; action dated Jun. 19, 2018; (2 pages).
Japanese Office Action for related Japanese Application No. 2017-091780; action dated Mar. 13, 2018; (3 pages).
European Search Report dated Aug. 10, 2017 in corresponding European Patent Application No. 17171960.2.

* cited by examiner

PROTECTIVE GLASS FOR SOLAR CELL MODULE AND MANUFACTURING METHOD FOR THE SAME

CROSS-REFERENCE TO RELATED APPLICATIONS

This application claims the priority of Korean Patent Application No. 10-2016-0182379 filed on Dec. 29, 2016, in the Korean Intellectual Property Office, the disclosure of which is hereby incorporated by reference in its entirety.

BACKGROUND

1. Technical Field

The present disclosure relates to a protective glass for a solar cell module having an increased incident light efficiency and a manufacturing method for the same.

2. Description of the Related Art

Recently, large efforts have been made to develop technologies for generating alternative energy from natural energy, such as, for example, generation of electricity using light and wind power, in view of energy saving, efficiency, and prevention of global warming.

Among such technologies, the solar cell module does not use fossil fuels such as coal or petroleum, but uses solar heat, which is a pollution-free infinite energy source. For this reason, the solar cell module has come into spotlight as a new alternative energy technology for the future, and is being currently used to obtain electric power necessary for vehicles and buildings.

As shown in FIG. 1, a solar cell module 1 includes a lower substrate 10, a solar cell 20 disposed on an upper portion of the lower substrate 10, a frame 30 disposed on the upper portion of the lower substrate 10 and formed to surround the periphery of the solar cell 20, a sealing member 40 disposed on the upper and lower portions of the solar cell 20 to seal the solar cell 20, and a protective glass 50 disposed on the upper portion of the solar cell 20 to protect the solar cell 20.

The protective glass 50 is typically formed of flat glass. However, when the protective glass 50 onto which light is incident is formed in the shape of a flat plate, about 8% of the incident light is reflected by the surface of the protective glass 50.

In addition, the protective glass 50 having the shape of a flat plate has no space for absorbing external shock, and thus a large area of the protective glass may be damaged when an external shock is applied thereto.

SUMMARY

It is an object of the present disclosure to provide a protective glass for a solar cell module that improves power generation efficiency of a solar cell by minimizing reflection of light incident onto the protective glass by forming the protective glass in a spherical or hemispherical shape, and a manufacturing method for the same.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a protective glass for a solar cell module includes a plurality of glass beads formed in a spherical or hemispherical shape and arranged in a horizontal direction. The plurality of glass beads is disposed on at least one of the upper and lower portions of the sealing member.

In accordance with another aspect of the present disclosure, a method of manufacturing a protective glass for a solar cell module includes preparing a plurality of glass beads formed in a spherical or hemispherical shape, arranging the glass beads in a horizontal direction, and injecting a molten glass solution into the glass beads and forming the protective glass.

According to the present disclosure, as the protective glass for a solar cell module is formed using glass beads having a spherical or hemispherical shape, external shock applied to the protective glass is absorbed into the spaces between the glass beads. Therefore, spreading of the shock is attenuated compared to the protective glass having the shape of a flat plate, and accordingly the area damaged by external shock may be reduced.

In addition, since spherical or hemispherical glass beads refract light that is incident in various directions, they may suppress reflection of the incident light to the outside. Accordingly, the solar cell can collect a larger amount of light than the solar cell module having the protective glass with a flat plate shape, and thus the power generation efficiency of the solar cell may be enhanced.

In addition, since the glass beads are attached to at least one of the upper and lower portions of the sealing member by heat treatment, the glass beads may be firmly adhered to the sealing member without using any separate adhesive.

DETAILED DESCRIPTION

Figure 1:
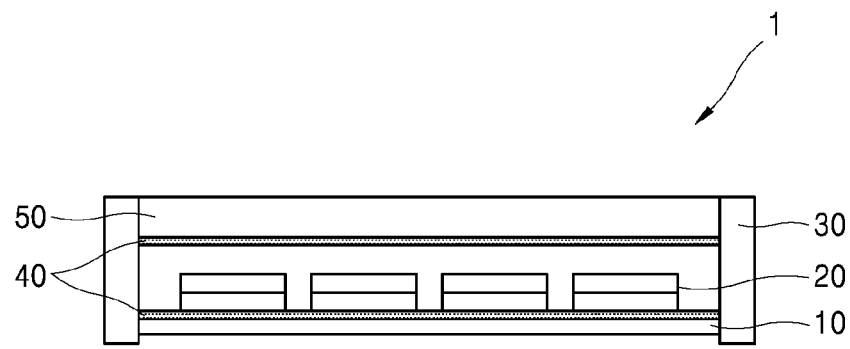
FIG. 1 is a cross-sectional view of a conventional solar cell module.
Figure 2:
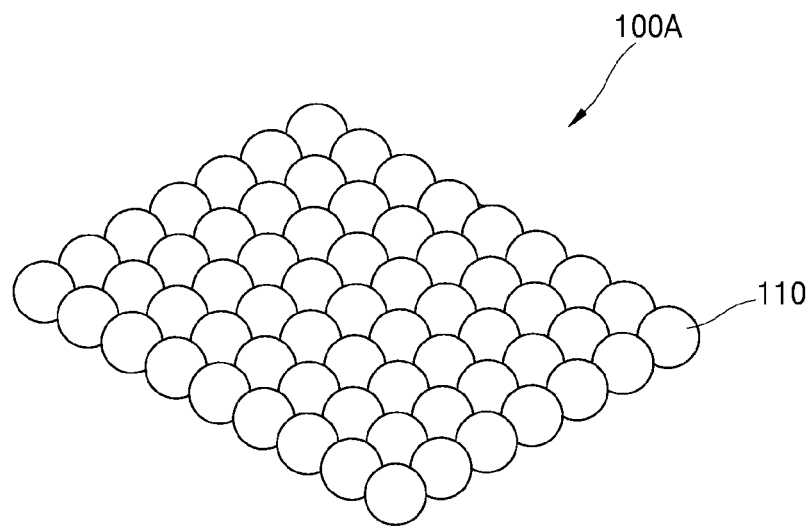
FIG. 2 is a perspective view illustrating a protective glass for a solar cell module according to an embodiment of the present disclosure.
Figure 3:
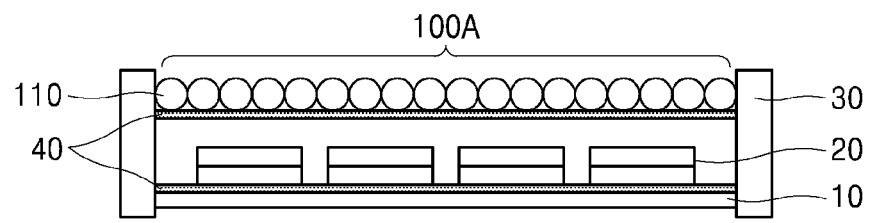
FIG. 3 is a cross-sectional view illustrating a solar cell module provided with the protective glass shown in FIG. 2.
Figure 4:
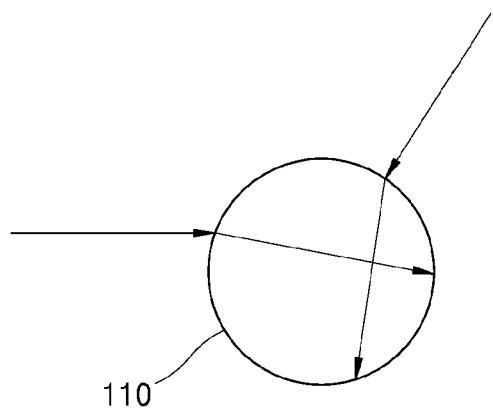
FIG. 4 is a view illustrating a travel direction of light incident onto the protective glass shown in FIG. 2.

The above objects, features and advantages will become apparent from the detailed description with reference to the accompanying drawings. Embodiments are described in sufficient detail to enable those skilled in the art in the art to easily practice the technical idea of the present disclosure. Redundant description and detailed descriptions of well-known functions or configurations may be omitted in order not to unnecessarily obscure the gist of the present disclosure. Hereinafter, a protective glass for a solar cell module according to preferred embodiments of the present disclosure will be described in detail with reference to the accompanying drawings. Throughout the drawings, like reference numerals refer to like elements. Embodiments of the disclosure are provided to more fully describe the present disclosure to those skilled in the art. It will be appreciated that for clarity of illustration, the shapes and dimensions of some of the elements can be exaggerated FIG. 2 is a perspective view illustrating a protective glass for a solar cell module according to an embodiment of the present disclosure, and FIG. 3 is a cross-sectional view illustrating a solar cell module provided with the protective glass shown in FIG. 2. FIG. 4 is a view illustrating a travel direction of light incident onto the protective glass shown in FIG. 2.

As shown in FIGS. 2 to 4, the protective glass 100A for a solar cell module is disposed on a sealing member 40 that seals solar cells 20 installed in a frame 30. Thus, the protective glass 100A serves to protect the solar cells 20. The protective glass 100A for a solar cell module includes a plurality of glass beads 110 formed in a spherical or hemispherical shape.

The plurality of glass beads 110 may be arranged in a horizontal direction and be disposed on at least one of the upper and lower portions of the sealing member 40.

That is, the plurality of glass beads 110 may be disposed on the upper portion of the sealing member 40 as shown in FIG. 3. Although not shown, the plurality of glass beads 110 may be disposed on the lower portion of the sealing member 40, or may be disposed on both the upper portion and lower portion of the sealing member 40. Here, the plurality of glass beads 110 is preferably formed such that the outer circumferential surfaces of the neighboring glass beads are in contact with each other. Alternatively, the glass beads 110 may be disposed spaced apart from each other.

Specifically, the glass beads 110 may be heat-treated so as to be attached to the sealing member 40 while being disposed on at least one of the upper and lower portions of the sealing member 40. That is, the glass beads 110 are disposed on at least one of the upper and lower portions of the sealing member 40 and then subjected to heat treatment. Accordingly, either the sealing member 40 or the glass beads 110 may be melted, so that the glass beads 110 may be attached to the sealing member 40. Since the sealing member 40 is typically made of a transparent resin material such as EVA, epoxy, or acryl, the sealing member 40 has a melting point lower than that of the glass beads 110, and is thus melted when heat treatment is performed thereon.

As described above, when the protective glass 100A for a solar cell module is formed using glass beads 110 having a spherical or hemispherical shape, as shown in FIG. 3, spaces will be formed between the contact surfaces of the glass beads 110.

Accordingly, when there is an external shock applied, the shock is absorbed into the spaces between the glass beads 110, and thus spreading of the external shock may be attenuated compared to the flat plate-shaped protective glass, and the area damaged by the external shock may be reduced.

In addition, as shown in FIG. 4, the spherical or hemispherical glass beads 110 may refract light that is incident in various directions, thereby suppressing reflection of light to the outside. In particular, since even the light incident at the angle of 0° can be prevented from being reflected but collected by the solar cell 20, the power generation efficiency of the solar cell 20 may be enhanced.

In addition, since the glass beads 110 are attached to at least one of the upper and lower portions of the sealing member 40 by heat treatment, the glass beads 110 may be firmly adhered to the sealing member 40 without using a separate adhesive.

The glass beads 110 may be formed of tempered low-iron glass. Accordingly, the glass beads 110 may protect the solar cell 20 from an external shock or the like and prevent reflection of incident light, thereby increasing the light transmittance.

In order to minimize reflection of incident light, the glass beads 110 may be processed through anti-reflection coating.

As described above, the glass beads 110 are formed of tempered low-iron glass and have a reduced reflectance of light due to the anti-reflection coating process. Thereby, the power generation efficiency of the solar cell 20 may be further enhanced.

The diameter of the glass beads 110 may be 3.2 mm to 8.0 mm. If the diameter of the glass beads 110 is less than 3.2 mm, the flatness of the glass beads 110 may increase, resulting in a reduced refractive index. If the diameter of the glass beads 110 exceeds 8.0 mm, the height of the protective glass may increase, resulting in the increased total volume of the solar cell module.

Figure 5:
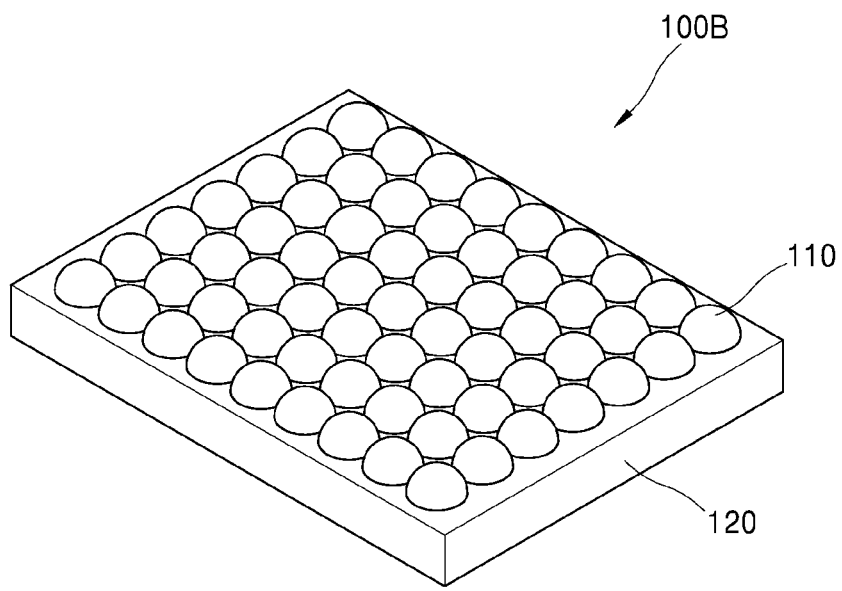
FIG. 5 is a perspective view illustrating a protective glass for a solar cell module according to another embodiment of the present disclosure.
Figure 6:
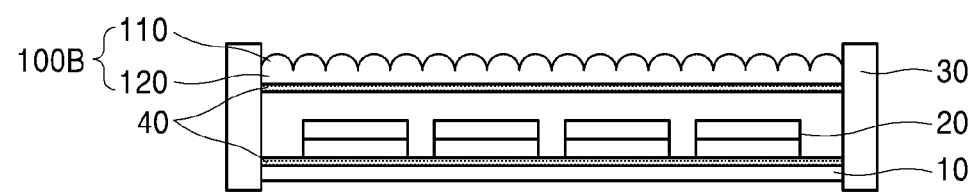
FIG. 6 is a cross-sectional view illustrating a solar cell module provided with the protective glass shown in FIG. 5.

FIG. 5 is a perspective view illustrating a protective glass for a solar cell module according to another embodiment of the present disclosure, and FIG. 6 is a cross-sectional view illustrating a solar cell module provided with the protective glass shown in FIG. 5. In this embodiment, differences from the above-described embodiment will be mainly described.

As shown in FIGS. 5 and 6, the protective glass 100B for a solar cell module may further include a glass substrate 120 attached to at least one of the upper and lower portions of the sealing member 40, and the glass beads 110 may be disposed on one surface of the glass substrate 120. The glass beads 110 may be formed in a hemispherical shape to increase the attached area.

The glass beads 110 are preferably disposed on the top of the glass substrate 120. Alternatively, the glass beads 110 may be disposed on the bottom of the glass substrate 120. The glass beads 110 may be disposed on both the top and bottom of the glass substrate 120.

As the protective glass 100B for a solar cell module further includes the glass substrate 120, attaching the protective glass 100B to the sealing member 40 may prevent penetration of foreign substances into the frame 30.

Figure 7:
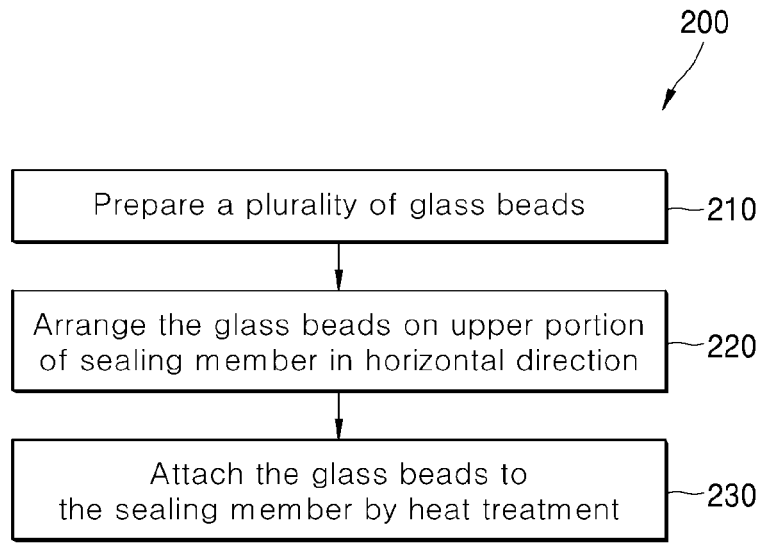
FIG. 7 is a flowchart illustrating a method of manufacturing a protective glass for a solar cell module according to an embodiment of the present disclosure.

FIG. 7 is a flowchart illustrating a method of manufacturing a protective glass for a solar cell module according to an embodiment of the present disclosure.

As shown in FIG. 7, the manufacturing method 200 for a protective glass for a solar cell module includes a step 210 of preparing a plurality of glass beads, a step 220 of arranging the glass beads on a sealing member in a horizontal direction, and a step 230 of attaching the glass beads to the sealing member by heat treatment.

The step 210 of preparing a plurality of glass beads includes preparing a plurality of glass beads 110 formed in a spherical or hemispherical shape. Here, the diameter of the glass beads 110 may be 3.2 mm to 8.0 mm.

The glass beads 110 may be formed of tempered low-iron glass in order to protect the solar cell 20 from an external shock or the like and to prevent reflection of incident light to enhance the light transmittance. In addition, anti-reflection coating may be performed on the surface of the glass beads 110 to minimize reflection of incident light.

The step 220 of arranging the glass beads on the sealing member in the horizontal direction includes arranging the glass beads 110 on at least one of the upper and lower portions of the sealing member 40 in the horizontal direction. Although the glass beads 110 can be disposed spaced apart from each other, the outer circumferential surfaces of the glass beads 110 are preferably formed to be in contact with each other in order to enhance the refractive index.

The step 230 of attaching the glass beads to the sealing member by heat treatment includes attaching the glass beads 110 to the sealing member 40 by heat-treating the sealing member 40 and the glass beads 110. Since the sealing member 40 is formed of a transparent resin material having a lower melting point than the glass beads 110, the glass beads 110 may be attached to the sealing member 40 as the sealing member 40 is melted.

Then, the protective glass 100A for a solar cell module attached to the upper portion of the sealing member 40 may be obtained as shown in FIG. 3.

Figure 8:
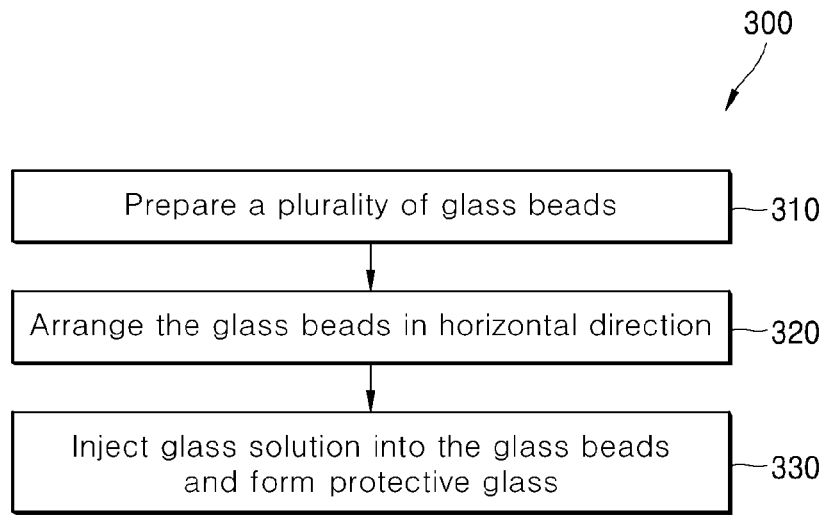
FIG. 8 is a flowchart illustrating a method of manufacturing a protective glass for a solar cell module according to another embodiment of the present disclosure.

FIG. 8 is a flowchart illustrating a method of manufacturing a protective glass for a solar cell module according to another embodiment of the present disclosure. As shown in FIG. 8, the manufacturing method 300 for a protective glass for a solar cell module includes a step 310 of preparing a plurality of glass beads, a step 320 of arranging the glass beads in a horizontal direction, and a step 330 of injecting a glass solution into the glass beads and forming the protective glass.

The step 310 of preparing a plurality of glass beads includes preparing a plurality of glass beads 110 formed in a spherical or hemispherical shape. Specifically, the glass beads 110 preferably have a spherical shape with a diameter of 3.2 mm to 8.0 mm.

The step 320 of arranging the glass beads in the horizontal direction includes horizontally arranging the glass beads in a protective glass manufacturing frame, wherein a surface of the protective glass manufacturing frame on which the glass beads 110 are placed is formed to be flat. Here, the protective glass manufacturing frame may be formed in a box shape with an open top to prevent the glass beads 110 from being separated.

Although the glass beads 110 can be arranged spaced apart from each other, the outer circumferential surfaces of the glass beads 110 are preferably formed to be in contact with each other to enhance the refractive index. The step 330 of injecting the glass solution and forming the protective glass includes injecting a molten glass solution into the protective glass manufacturing frame in which the glass beads 110 are disposed and forms the protective glass. That is, the glass solution is injected into empty spaces between the glass beads 110, and the glass beads 110 are cured such that the glass beads 110 are bonded.

The step 330 of injecting the glass solution into the protective glass manufacturing frame and forming the protective glass may include injecting the glass solution to a height less than half the height of the glass beads 110. Accordingly, even when the glass solution is injected, the upper portions of the glass beads 110 may maintain the hemispherical shape, and therefore the reflectance of light incident onto the glass beads 110 may be reduced.

The manufacturing method 300 for a protective glass for a solar cell module may further include a step of removing the protective glass from the protective glass manufacturing frame after the step 330 of injecting the glass solution and forming the protective glass. Thereby, the protective glass 100B for a solar cell module of the type shown in FIG. 5 may be obtained.

The protective glass 100B for a solar cell module may be formed of tempered low-iron glass in order to protect the solar cell 20 from an external shock or the like and to prevent reflection of incident light to enhance the light transmittance. In addition, anti-reflection coating may be performed on the surface of the obtained protective glass 100B to minimize reflection of incident light.

While the present disclosure has been particularly shown and described with reference to exemplary embodiments thereof shown in accompanying drawings, it is clearly understood that the same is by way of illustration and example only and is not to be taken by way of limitation and that the present disclosure described above may be variously substituted, altered, and modified by those skilled in the art to which the present invention pertains without departing from the scope and sprit of the present disclosure. Therefore, the true scope of protection of the present disclosure should be determined only by the appended claims.

What is claimed is:

1. A protective glass for a solar cell module to be disposed on a sealing member for sealing a solar cell installed in a frame to protect the solar cell, the protective glass comprising:
   a plurality of glass beads formed in a spherical or hemispherical shape and arranged in a horizontal direction,
   wherein the plurality of glass beads is configured to be disposed on at least one of an upper portion and a lower portion of the sealing member, wherein the plurality of glass beads has a melting point higher than that of the sealing member, wherein the glass beads are processed by heat treatment and configured to be attached to the sealing member, and
   wherein empty spaces are formed between contact surfaces of the glass beads.

2. The protective glass according to claim 1, wherein the glass beads are formed of tempered low-iron glass, which has a ferric oxide content of about 0.01%.

3. The protective glass according to claim 1, wherein the glass beads are anti reflective coated.

4. The protective glass according to claim 1, wherein a diameter of the glass beads is 3.2 mm to 8.0 mm.

5. A protective glass for a solar cell module to be disposed on a sealing member for sealing a solar cell installed in a frame to protect the solar cell, the protective glass comprising:
   a plurality of glass beads formed in a spherical or hemispherical shape and arranged in a horizontal direction; and
   a glass substrate attached to at least one of an upper portion and a lower portion of the sealing member,
   wherein the plurality of glass beads is configured to be disposed on at least one of the upper portion and the lower portion of the sealing member, wherein the glass beads are disposed on one surface of the glass substrate, wherein the plurality of glass beads has a melting point higher than that of the sealing member, wherein the glass beads are processed by heat treatment and configured to be attached to the sealing member, and
   wherein empty spaces are formed between contact surfaces of the glass beads.

6. The protective glass according to claim 5, wherein the glass beads are formed of tempered low-iron glass, which has a ferric oxide content of about 0.01%.

7. The protective glass according to claim 5, wherein the glass beads are anti reflective coated.

8. The protective glass according to claim 5, wherein a diameter of the glass beads is 3.2 mm to 8.0 mm.

* * * * *